United States Patent
Katsuki et al.

(10) Patent No.: US 11,758,705 B2
(45) Date of Patent: Sep. 12, 2023

(54) ELECTROMAGNETIC WAVE SHIELDING FILM

(71) Applicant: TATSUTA ELECTRIC WIRE & CABLE CO., LTD., Higashiosaka (JP)

(72) Inventors: Takahiko Katsuki, Kizugawa (JP); Hiroshi Tajima, Kizugawa (JP); Yuusuke Haruna, Kizugawa (JP)

(73) Assignee: TATSUTA ELECTRIC WIRE & CABLE CO., LTD, Osaka (JP)

( * ) Notice: Subject to any disclaimer, the term of this patent is extended or adjusted under 35 U.S.C. 154(b) by 0 days.

(21) Appl. No.: 17/801,054

(22) PCT Filed: Feb. 25, 2021

(86) PCT No.: PCT/JP2021/006983
§ 371 (c)(1),
(2) Date: Aug. 19, 2022

(87) PCT Pub. No.: WO2021/172396
PCT Pub. Date: Sep. 2, 2021

(65) Prior Publication Data
US 2023/0086849 A1    Mar. 23, 2023

(30) Foreign Application Priority Data
Feb. 25, 2020   (JP) ................................ 2020-029765

(51) Int. Cl.
*H05K 9/00*        (2006.01)
(52) U.S. Cl.
CPC ................................ *H05K 9/0084* (2013.01)

(58) Field of Classification Search
CPC .................................................. H05K 9/0084
See application file for complete search history.

(56) References Cited

U.S. PATENT DOCUMENTS

| 10,015,915 B2* | 7/2018 | Tajima | H05K 9/0088 |
| 2019/0143636 A1* | 5/2019 | Seo | B32B 15/14 |
| | | | 361/760 |

(Continued)

FOREIGN PATENT DOCUMENTS

| JP | 2004095566 A | 3/2004 |
| WO | 2018147426 A1 | 8/2018 |

OTHER PUBLICATIONS

International Search Report dated May 11, 2021, issued in International Application No. PCT/JP2021/006983.

(Continued)

*Primary Examiner* — Hung V Ngo
(74) *Attorney, Agent, or Firm* — United IP Counselors, LLC; Kenneth M. Fagin

(57) ABSTRACT

Provided is an electromagnetic wave shielding film capable of easily exhibiting excellent conductivity between a ground member and a shielding layer when the ground member is disposed on the electromagnetic wave shielding film. In the electromagnetic wave shielding film 1, the conductive adhesive layer 11, the shielding layer 12, and the insulating layer 13 are laminated in this order, and a ratio [conductive adhesive layer/insulating layer] of Martens hardness of the conductive adhesive layer 11 in accordance with ISO14577-1 to Martens hardness of the insulating layer 13 in accordance with ISO14577-1 is 0.3 or more.

3 Claims, 1 Drawing Sheet

(56) References Cited

U.S. PATENT DOCUMENTS

| | | | | |
|---|---|---|---|---|
| 2019/0320563 A1* | 10/2019 | Shen | ................... | B32B 27/065 |
| 2021/0289615 A1* | 9/2021 | Ishioka | ................. | B32B 27/18 |
| 2022/0151119 A1* | 5/2022 | Yanagi | ................ | H05K 9/0083 |

OTHER PUBLICATIONS

Written Opinion dated May 11, 2021, issued in International Application No. PCT/JP2021/006983.

\* cited by examiner

ELECTROMAGNETIC WAVE SHIELDING FILM

TECHNICAL FIELD

The present invention relates to an electromagnetic wave shielding film. More specifically, the present invention relates to an electromagnetic wave shielding film used for a printed wiring board.

BACKGROUND ART

Printed wiring boards are widely used in electronic devices such as mobile phones, video cameras, and notebook computers to incorporate circuits into the mechanisms. It is also used for connecting a movable unit such as a printer head and a control unit. In these electronic devices, electromagnetic wave shielding measures are indispensable, and shield printed wiring boards to which an electromagnetic wave shielding measure is applied are also used in the printed wiring boards used in the devices.

A general shielded printed wiring board is usually composed of: a substrate film in which a printed circuit and an insulating film are sequentially provided on a base film; and an electromagnetic wave shielding film comprising an adhesive layer, a shielding layer laminated on the adhesive layer, and an insulating layer laminated on the adhesive layer, in which the electromagnetic wave shielding film is laminated on the substrate film so that the adhesive layer is in contact with the substrate film (hereinafter, may be simply referred to as "shielding film").

The printed circuit includes a ground circuit, and the ground circuit is electrically connected to the housing of the electronic device for grounding. In order to electrically connect the ground circuit and the housing of the electronic device, it is necessary to form a hole in a part of the insulating film and the shielding film in advance. This has been a factor that hinders printed circuit design flexibility.

Patent Literature 1 discloses a shielding film obtained by forming an insulating layer (cover film) on one surface of a separate film by coating, and providing a shielding layer composed of a metal thin film layer and an adhesive layer on a surface of the insulating layer, wherein the shielding film has a protrusion or a conductive filler (connection portion) pressed against the insulating layer to be connected to the shielding layer on one end side, and a ground member formed so that the other end side is exposed and connectable to a ground portion in the vicinity thereof.

When the shielding film described in Patent Literature 1 is prepared, the ground member is pressed against the insulating layer so that the protrusion of the ground member and the conductive filler penetrates the insulating layer. Accordingly, since the ground member and the shielding layer are electrically connected to each other, the ground member can be disposed at an arbitrary position of the shielding film. When a shield printed wiring board is produced using such a ground member, the ground circuit can be electrically connected to the housing of the electronic device at an arbitrary position.

CITATION LIST

Patent Literature

Patent Literature 1: Japanese Patent Laid-Open No. 2004-95566

SUMMARY OF INVENTION

Technical Problem

However, in some cases, the protrusions of the ground member do not sufficiently penetrate the insulating layer and cannot sufficiently contact the shielding layer of the shielding film. Further, even in a case where the protrusions of the ground member or the conductive filler (hereinafter simply referred to as "protrusion") sufficiently penetrate the insulating layer, the protrusions of the ground member push and deform the conductive adhesive layer located on the rear surface side of the shielding layer together with the shielding layer, and the conductive filler in the conductive adhesive layer is pushed aside by the protrusions and moves away from the circuit. In these cases, there is a problem that the electric resistance value increases, and the connection between the ground member, the shielding film, and the circuit of the printed wiring board is damaged.

The present invention has been made in view of the above, and an object of the present invention is to provide an electromagnetic wave shielding film capable of easily exhibiting excellent conductivity between a ground member and a shielding layer when the ground member is disposed on the electromagnetic wave shielding film.

Solution to Problem

As a result of intensive studies to achieve the above object, the present inventors have found that excellent conductivity can be easily exhibited between the ground member and the shielding layer when the ground member is disposed on the electromagnetic wave shielding film by specifying the relationship between the Martens hardness, which is an index indicating the hardness of a minute region, of the insulating layer and the conductive adhesive layer in the shielding film. The present invention has been completed based on these findings.

That is, the present invention provides an electromagnetic wave shielding film comprising a conductive adhesive layer, a shielding layer, and an insulating layer laminated in this order, in which a ratio [conductive adhesive layer/insulating layer] of Martens hardness of the conductive adhesive layer in accordance with ISO14577-1 to Martens hardness of the insulating layer in accordance with ISO14577-1 is 0.3 or more.

In the electromagnetic wave shielding film, the above Martens hardness ratio of 0.3 or more indicates that the Martens hardness of the conductive adhesive layer is relatively large compared to the insulating layer. When the protrusion of the ground member is pressed so as to penetrate the insulating layer, pressure is locally applied from the protrusion to the laminated insulating layer, shielding layer, and conductive adhesive layer. At this time, since the Martens hardness of the insulating layer is relatively low, the pressure is locally applied to the insulating layer, and the protrusion of the ground member can easily penetrate the insulating layer. When the protrusion of the ground member penetrates the insulating layer and comes into contact with the shielding layer, the conductive adhesive layer is less likely to be deformed by a pressure locally applied via the shielding layer because the Martens hardness of the conductive adhesive layer located on the rear surface side of the shielding layer is relatively high, and contact between the conductive particles in the conductive adhesive layer and the shielding layer or between the conductive particles and the printed wiring board is less likely to be impaired. Therefore, in the electromagnetic wave shielding film having the structure described above, the protrusion of the ground member penetrating the insulating layer can stably come into contact with the shielding layer, and thus excellent conductivity between a ground member and a shielding layer when the ground member is disposed on the electromagnetic wave shielding film can be easily exhibited.

The Martens hardness of the insulating layer in accordance with ISO14577-1 is preferably 3 to 150 N/mm$^2$. In the electromagnetic wave shielding film having such a configuration, the local hardness of the insulating layer becomes appropriate, and thus the protrusion of the ground member can easily penetrate the insulating layer.

The Martens hardness of the conductive adhesive layer in accordance with ISO14577-1 is preferably 20 to 200 N/mm$^2$. In the electromagnetic wave shielding film having such a configuration, the local hardness of the conductive adhesive layer becomes appropriate, so that when the protrusion of the ground member presses the shielding layer, the conductive adhesive layer is not easily deformed or easily returns to the original state even when deformed, and the contact between the conductive particles in the conductive adhesive layer and the shielding layer or between the conductive particles and the printed wiring board is less likely to be impaired.

Advantageous Effects of Invention

The electromagnetic wave shielding film of the present invention can easily exhibit excellent conductivity between a ground member and a shielding layer when the ground member is disposed on the electromagnetic wave shielding film.

DESCRIPTION OF EMBODIMENTS

Electromagnetic Wave Shielding Film

The electromagnetic wave shielding film of the present invention includes a conductive adhesive layer, a shielding layer which is a layer for blocking electromagnetic waves, and an insulating layer.

Figure 1:
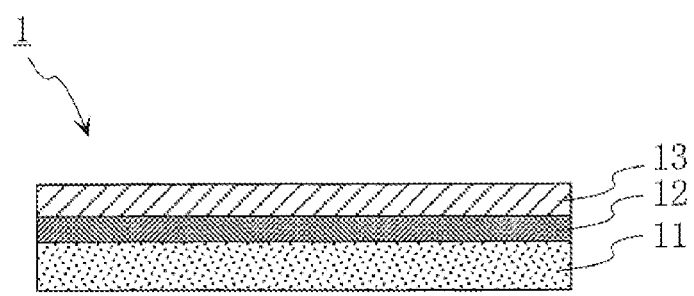
FIG. 1 is a schematic cross-sectional view showing an embodiment of an electromagnetic wave shielding film of the present invention.

An embodiment of the electromagnetic wave shielding film of the present invention will be described below. FIG. 1 is a schematic cross-sectional view showing an embodiment of the electromagnetic wave shielding film of the present invention.

The shielding film 1 shown in FIG. 1 has a conductive adhesive layer 11, a shielding layer 12 formed on a surface of the conductive adhesive layer 11, and an insulating layer 13 formed on a surface of the shielding layer 12. That is, in the shielding film 1, the conductive adhesive layer 11, the shielding layer 12, and the insulating layer 13 are laminated in this order. The conductive adhesive layer 11 and the shielding layer 12, and the shielding layer 12 and the insulating layer 13 may not be laminated so as to be in contact with each other. That is, at least one optional layer may be provided between the conductive adhesive layer and the shielding layer, or between the shielding layer and the insulating layer.

The ratio [conductive adhesive layer/insulating layer] of the Martens hardness of the conductive adhesive layer to the Martens hardness of the insulating layer is 0.3 or more, preferably 0.5 or more, more preferably 0.6 or more, and still more preferably 1.0 or more. The Martens hardness is a value measured in accordance with ISO14577-1.

In the electromagnetic wave shielding film of the present invention, the above Martens hardness ratio of 0.3 or more indicates that the Martens hardness of the conductive adhesive layer is relatively large compared to the insulating layer. When the protrusion of the ground member is pressed so as to penetrate the insulating layer, pressure is locally applied from the protrusion to the laminated insulating layer, shielding layer, and conductive adhesive layer. At this time, since the Martens hardness of the insulating layer is relatively low, the pressure is locally applied to the insulating layer, and the protrusion of the ground member can easily penetrate the insulating layer. When the protrusion of the ground member penetrates the insulating layer and comes into contact with the shielding layer, the conductive adhesive layer is less likely to be deformed by a pressure locally applied via the shielding layer because the Martens hardness of the conductive adhesive layer located on the rear surface side of the shielding layer is relatively high, and contact between the conductive particles in the conductive adhesive layer and the shielding layer or between the conductive particles and the printed wiring board is less likely to be impaired. Therefore, in the electromagnetic wave shielding film having the structure described above, the protrusion of the ground member penetrating the insulating layer can stably come into contact with the shielding layer, and thus excellent conductivity between a ground member and a shielding layer when the ground member is disposed on the electromagnetic wave shielding film can be easily exhibited.

The Martens hardness ratio [conductive adhesive layer/insulating layer] is, for example, 50.0 or less, preferably 10.0 or less, more preferably 5.0 or less, still more preferably 3.0 or less, and particularly preferably 2.0 or less.

Conductive Adhesive Layer

The conductive adhesive layer 11 has, for example, adhesiveness for adhering the electromagnetic wave shielding film of the present invention to a printed wiring board and conductivity. The conductive adhesive layer is preferably formed adjacent to the electromagnetic wave shielding layer. The conductive adhesive layer may be either a single layer or a multilayer.

The conductive adhesive layer preferably contains a binder component and conductive particles.

Examples of the binder component include thermoplastic resins, thermosetting resins, and active energy ray-curable compounds. Only one kind of the binder component may be used, or two or more kinds of binder components may be used.

Examples of the thermoplastic resin include polystyrene-based resins, vinyl acetate-based resins, polyester-based resins, polyolefin-based resins (for example, polyethylene-based resins and polypropylene-based resin compositions), polyimide-based resins, and acrylic resins. Only one kind of the thermoplastic resin may be used, or two or more kinds of the thermoplastic resins may be used.

Examples of the thermosetting resin include both a resin having thermosetting properties (thermosetting resin) and a resin obtained by curing the thermosetting resin. Examples of the thermosetting resin include phenol-based resins, epoxy-based resins, urethane-based resins, melamine-based resins, and alkyd-based resins. Only one kind of the thermosetting resin may be used, or two or more kinds of the thermosetting resins may be used.

Examples of the epoxy-based resin include bisphenol-type epoxy-based resins, spiro-ring-type epoxy-based resins, naphthalene-type epoxy-based resins, biphenyl-type epoxy-based resins, terpene-type epoxy-based resins, glycidyl ether-type epoxy-based resins, glycidylamine-type epoxy-based resins, and novolac-type epoxy-based resins.

Examples of the bisphenol type epoxy resin include bisphenol A-type epoxy resins, bisphenol F-type epoxy resins, bisphenol S-type epoxy resins, and tetrabrombisphenol A-type epoxy resins. Examples of the glycidyl ether-type epoxy resin include tris(glycidyloxyphenyl)methane and tetrakis(glycidyloxyphenyl)ethane. Examples of the glycidylamine-type epoxy resin include tetraglycidyldiaminodiphenylmethane. Examples of the novolac-type epoxy resin include cresol novolac-type epoxy resins, phenol novolac-type epoxy resins, α-naphthol novolac-type epoxy resins, and brominated phenol novolac-type epoxy resins.

The epoxy-based resin may be an epoxy resin (modified epoxy resin) containing a modified portion having a self-reactivity in addition to the epoxy group, such as an epoxy resin having a (meth)acryloyl group (acrylic modified epoxy resin). In a case where such a modified epoxy resin is used, the Martens hardness of the conductive adhesive layer can be easily adjusted to an appropriate range by utilizing crosslinking.

Examples of the active energy ray-curable compound include both a compound curable by irradiation with active energy rays (active energy ray-curable compound) and a compound obtained by curing the active energy ray-curable compound. The active energy ray-curable compound is not particularly limited, and examples thereof include a polymerizable compound having one or more (preferably two or more) radical reactive groups (for example, (meth)acryloyl group) in the molecule. Only one kind of the active energy ray-curable compound may be used, or two or more kinds of the active energy ray-curable compounds may be used.

As the binder component, a thermosetting resin is particularly preferable. In this case, after the electromagnetic wave shielding film of the present invention is disposed on the printed wiring board for adhesion to the printed wiring board, the binder component can be cured by pressurization and heating, and adhesiveness to the printed wiring board becomes better.

In a case where the binder component contains a thermosetting resin, a curing agent for accelerating the thermosetting reaction may be contained as a component constituting the binder component. The curing agent can be appropriately selected depending on the type of the thermosetting resin. Only one kind of the curing agent may be used, or two or more kinds of the curing agents may be used.

The content ratio of the binder component in the conductive adhesive layer is not particularly limited, but is preferably 5 to 60 mass %, more preferably 10 to 50 mass %, and still more preferably 20 to 45 mass % with respect to 100 mass % of the total amount of the conductive adhesive layer. When the content ratio is 5 mass % or more, the adhesion to the printed wiring board is more excellent. When the content ratio is 60 mass % or less, the conductive particles can be sufficiently contained.

Examples of the conductive particles include metal particles, metal-coated resin particles, metal fibers, carbon fillers, and carbon nanotubes. Only one kind of the conductive particles may be used, or two or more kinds of the conductive particles may be used.

Examples of the metal constituting the coating portion of the metal particles and the metal-coated resin particles include gold, silver, copper, nickel, and zinc. Only one kind of the metal may be used, or two or more kinds of the metal may be used.

Specific examples of the metal particles include copper particles, silver particles, nickel particles, silver-coated copper particles, gold-coated copper particles, silver-coated nickel particles, gold-coated nickel particles, and silver-coated alloy particles. Examples of the silver-coated alloy particles include silver-coated copper alloy particles in which alloy particles containing copper (for example, copper alloy particles composed of an alloy of copper, nickel, and zinc) are coated with silver. The metal particles can be produced by an electrolytic method, an atomizing method, a reducing method, or the like.

As the metal particles, silver particles, silver-coated copper particles, and silver-coated copper alloy particles are preferable among them. Silver-coated copper particles and silver-coated copper alloy particles are particularly preferable from the viewpoint of excellent conductivity, suppressing oxidation and aggregation of the metal particles, and reducing the cost of the metal particles.

Examples of the shape of the conductive particles include spherical, flake-like (scaly), dendritic, fibrous, and amorphous (polyhedron).

The median size (D50) of the conductive particles is preferably 1 to 50 μm, and more preferably 3 to 40 μm. When the median size is 1 μm or more, the dispersibility of the conductive particles is good, aggregation can be suppressed, and oxidation is difficult. When the average particle size is 50 μm or less, the conductivity becomes good. The median size can be measured from the volume-based particle size distribution.

The conductive adhesive layer may be a layer having isotropic conductivity or anisotropic conductivity, as necessary. In particular, the conductive adhesive layer preferably has anisotropic conductivity from the viewpoint of improving the transmission characteristics of high-frequency signals transmitted in the signal circuit of the printed wiring board.

The content ratio of the conductive particles in the conductive adhesive layer is not particularly limited, but is preferably 2 to 80 mass %, more preferably 5 to 60 mass %, and still more preferably 10 to 40 mass % with respect to 100 mass % of the total amount of the conductive adhesive layer. When the content ratio is 2 mass % or more, the conductivity becomes better. When the content ratio is 80 mass % or less, the binder component can be sufficiently contained and the adhesion to the printed wiring board becomes better.

The conductive adhesive layer preferably contains a filler other than the conductive particles. By blending a filler, the Martens hardness of the conductive adhesive layer can be adjusted. Only one kind of the filler may be used, or two or more kinds of the fillers may be used.

As the filler, an inorganic filler or an organic filler can be used. From the viewpoint of increasing the Martens hardness of the conductive adhesive layer, an inorganic filler, an organic filler composed of crosslinkable resin particles, and an organic phosphorus-based compound are preferable. Examples of the inorganic filler include metal oxides such as silica, boron oxide, alumina, titania, and zirconia; phosphorus compounds such as red phosphorus; metal carbides such as silicon carbide, boron carbide, and titanium carbide;

metal nitrides such as aluminum nitride, boron nitride, and titanium nitride; metal hydroxides such as magnesium hydroxide and aluminum hydroxide; and carbonates such as calcium carbonate and magnesium carbonate. Examples of the crosslinkable resin particles include polyolefins such as polyethylene, polypropylene, polystyrene, polyvinyl chloride, polyvinylidene chloride, polytetrafluoroethylene, polyisobutylene, and polybutadiene; acrylic resins such as polymethyl methacrylate and polymethyl acrylate; copolymer resins of acrylate and divinylbenzene, polyalkylene terephthalate, polysulfone, polycarbonate, polyamide, phenol formaldehyde resin, melamine formaldehyde resin, benzoguanamine formaldehyde resin, and urea formaldehyde resin. Examples of the organic phosphorus-based compound include phosphorus-based compounds such as phosphate esters and metal salts of phosphinic acid. In a case where the organic filler is a phosphorus-based compound such as a phosphate ester or a metal salt of phosphinic acid, the organic filler also has a function as a flame retardant, and thus it is possible to impart flame retardancy while controlling the Martens hardness.

The median size (D50) of the filler is preferably 0.01 to 100 μm, and more preferably 1 to 20 μm, from the viewpoint that the Martens hardness of the conductive adhesive layer can be easily controlled. The median size can be measured from the volume-based particle size distribution.

The content ratio of the filler in the conductive adhesive layer is not particularly limited, but is preferably 1 to 70 mass %, more preferably 10 to 60 mass %, and still more preferably 35 to 50 mass % with respect to 100 mass % of the total amount of the conductive adhesive layer. When the content ratio is within the above range, the Martens hardness can be easily adjusted within an appropriate range while maintaining the conductivity and the adhesion to the printed wiring board.

The conductive adhesive layer may contain other components other than the components described above as long as the effects of the present invention are not impaired. Examples of the other components include components contained in known or commonly used adhesive layers. Examples of the other components include flame retardants, flame retardant aids, antifoaming agents, viscosity modifiers, antioxidants, diluents, antisettling agents, colorants, leveling agents, coupling agents, ultraviolet absorbers, and tackifier resins, which do not correspond to the above fillers. Only one kind of the other component may be used, or two or more kinds of the other components may be used.

The Martens hardness of the conductive adhesive layer is preferably 20 to 200 N/mm$^2$, more preferably 30 to 180 N/mm$^2$, and still more preferably 50 to 170 N/mm$^2$. When the Martens hardness is within the above range, the local hardness of the conductive adhesive layer becomes appropriate, so that when the protrusion of the ground member presses the shielding layer, the conductive adhesive layer is not easily deformed or easily returns to the original state even when deformed, and the contact between the conductive adhesive layer and the shielding layer or between the conductive particles and the printed wiring board is less likely to be impaired. Further, when the Martens hardness is 200 N/mm$^2$ or less, the adhesion to the printed wiring board becomes good. The Martens hardness of the conductive adhesive layer is a value measured in accordance with ISO14577-1, and is measured at a surface on the shielding layer side.

The thickness of the conductive adhesive layer is preferably 3 to 20 μm, and more preferably 5 to 15 μm. When the thickness is 3 μm or more, more sufficient shielding performance can be exhibited as a shielding film that shields electromagnetic waves in the high frequency band generated inside. When the thickness is 20 μm or less, the flexibility of the shielding film is excellent.

(Shielding Layer)

The shielding layer 12 is formed on a surface of the conductive adhesive layer 11. As the shielding layer, a known or conventional shielding layer having an electromagnetic wave shielding property can be used. In particular, the shielding layer preferably includes a metal layer. The shielding layer may be either a single layer or a multilayer.

Examples of the metal constituting the metal layer include gold, silver, copper, aluminum, nickel, tin, palladium, chromium, titanium, zinc, and alloys thereof. The metal layer is preferably a metal plate or a metal foil. That is, as the metal layer, a copper plate (copper foil) and a silver plate (silver foil) are preferable.

The thickness of the shielding layer is preferably 0.01 to 10 μm. When the thickness is 0.01 μm or more, more sufficient shielding performance can be obtained. When the thickness is 10 μm or less, the bendability becomes better.

(Insulating Layer)

The insulating layer 13 is formed on a surface of the shielding layer 12. The insulating layer 13 has an insulating property and has a function of protecting the conductive adhesive layer 11 and the shielding layer 12 in the electromagnetic wave shielding film 1 of the present invention. The insulating layer may be either a single layer or a multilayer.

It is preferable that the insulating layer contains a binder component. Examples of the binder component include thermoplastic resins, thermosetting resins, and active energy ray-curable compounds. Examples of the thermoplastic resin, the thermosetting resin, and the active energy ray-curable compound include those exemplified as the binder component that may be contained in the conductive adhesive layer described above. Only one kind of the binder component may be used, or two or more kinds of binder components may be used. In particular, the binder component preferably contains a thermosetting resin and an active energy ray-curable compound.

The insulating layer may contain other components other than the binder component as long as the effects of the present invention are not impaired. Examples of the other components include flame retardants, flame retardant aids, antifoaming agents, viscosity modifiers, antioxidants, diluents, antisettling agents, fillers, colorants, leveling agents, coupling agents, ultraviolet absorbers, and tackifier resins. Only one kind of the other component may be used, or two or more kinds of the other components may be used.

The Martens hardness of the insulating layer is preferably 3 to 200 N/mm$^2$, more preferably 30 to 150 N/mm$^2$, still more preferably 50 to 140 N/mm$^2$, and particularly preferably 70 to 130 N/mm$^2$. When the Martens hardness is within the above range, the local hardness of the insulating layer becomes appropriate, and thus the protrusion of the ground member can easily penetrate the insulating layer. When the Martens hardness is 3 N/mm$^2$ or more, the surface of the insulating layer is moderately hard, and thus the protrusion of the ground member can easily pierce the protective layer. When the Martens hardness is 200 N/mm$^2$ or less, the surface of the insulating layer is moderately soft, and thus the protrusion of the ground member can easily penetrate the insulating layer. The Martens hardness of the insulating layer can be adjusted by designing, for example, the degree of curing of the thermosetting component constituting the insulating layer, the type of the curing agent, the type of the binder component, and the like. The Martens hardness of the insulating layer is a value measured in accordance with ISO14577-1, and is measured at a surface on the insulating layer on the side opposite to the shielding layer side.

The thickness of the insulating layer is preferably 1 to 15 µm, more preferably 3 to 10 µm. When the thickness is 1 µm or more, the shielding layer and the conductive adhesive layer can be more sufficiently protected. When the thickness is 15 µm or less, the flexibility is excellent, and it is also economically advantageous.

The electromagnetic wave shielding film of the present invention may have other layers other than the above layers. The other layer may be, for example, an anchor coat layer provided between the insulating layer and the shielding layer. In a case where an anchor coat layer is provided, the adhesion between the insulating layer and the shielding layer is improved.

Examples of the material for forming the anchor coat layer include urethane-based resins, acrylic resins, core-shell type composite resins having a urethane-based resin as a shell and an acrylic resin as a core, epoxy-based resins, polyimide-based resins, polyamide-based resins, melamine-based resins, phenol-based resins, urea-formaldehyde-based resins, blocked isocyanates obtained by reacting a polyisocyanate with a blocking agent such as phenol, polyvinyl alcohol, and polyvinylpyrrolidone. Only one kind of the material may be used, or two or more kinds of the materials may be used.

The electromagnetic wave shielding film of the present invention may have a separator (release film) on the insulating layer side and/or the conductive adhesive layer side. The separator is laminated so as to be releasable from the electromagnetic wave shielding film of the present invention. The separator is an element for coating and protecting the insulating layer and the conductive adhesive layer, and is peeled off when the electromagnetic wave shielding film of the present invention is used.

Examples of the separator include polyethylene terephthalate (PET) films, polyethylene films, polypropylene films, plastic films, and papers surface-coated with a release agent such as a fluorine-based release agent or a long-chain alkyl acrylate-based release agent.

The thickness of the separator is preferably 10 to 200 µm, and more preferably 15 to 150 µm. When the thickness is 10 µm or more, the protection performance is more excellent. When the thickness is 200 µm or less, the separator is easily released during use.

The electromagnetic wave shielding film of the present invention is preferably used for a printed wiring board, and particularly preferably for a flexible printed wiring board (FPC). The electromagnetic wave shielding film of the present invention can be preferably used as an electromagnetic wave shielding film for a flexible printed wiring board.

[Shield Printed Wiring Board]

Figure 2:
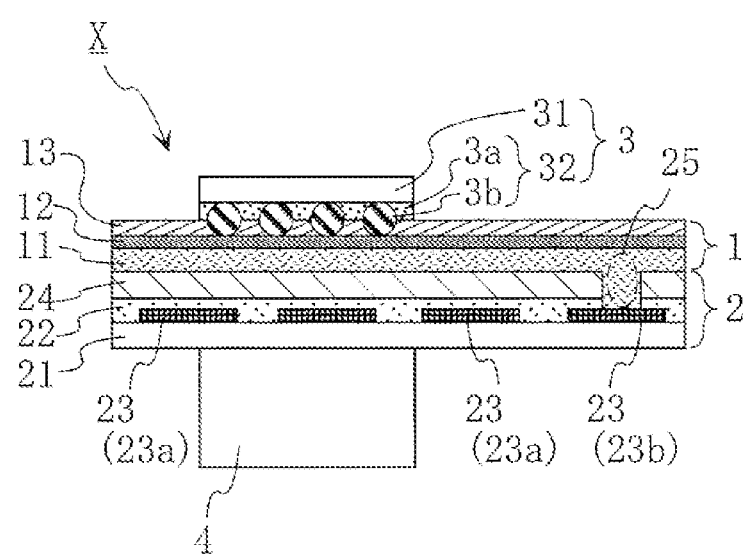
FIG. 2 is a schematic cross-sectional view showing an embodiment of a shield printed wiring board using the electromagnetic wave shielding film of the present invention.

FIG. 2 shows an embodiment of a shielding film printed wiring board including a shielding film 1 which is the electromagnetic wave shielding film of the present invention. A shield printed wiring board X shown in FIG. 2 has a printed wiring board 2, a shielding film 1, and a ground member 3. An electronic component 4 is connected to a mounting portion provided on a lower surface of the printed wiring board 2. Further, the shielding film 1 is provided on the printed wiring board 2 and is disposed up to a region facing the mounting portion to which the electronic component 4 is connected. Thus, noise such as electromagnetic waves from the outside to the mounting portion of the electronic component 4 is shielded by using the shielding film 1.

The ground member 3 is provided on the shielding film 1 and is disposed opposite to the mounting portion to which the electronic component 4 is connected. In FIG. 2, the ground member 3 is constituted of a conductive base material 31 and a conductive adhesive 32, and is laminated on the insulating layer 13 of the shielding film 1 by an adhesive 3a of the conductive adhesive 32. Conductive particles 3b contained in the conductive adhesive 32 protrude from the adhesive 3a contained in the conductive adhesive 32. The conductive base material 31 adhered via the conductive adhesive 32 is in contact with the conductive particles 3b. On the other hand, the conductive particles 3b protruding from a lower surface of the conductive adhesive 32 break through the insulating layer 13 of the shielding film 1 as protrusions provided on the ground member 3 and contact the shielding layer 12 thereunder. Thus, the conductive base material 31 and the shielding layer 12 of the shielding film 1 are brought into a conductive state via the conductive particles 3b of the conductive adhesive 32, and the ground member 3 having conductivity and the shielding layer 12 can be made to have the same potential. Therefore, the conductive ground member 3 can have a shielding effect. By bringing the ground member 3 into contact with the shielding layer 12, the ground member 3 can have at least a dual function of reinforcing the mounting portion of the electronic component 4 and shielding the mounting portion of the electronic component 4 from noise such as electromagnetic waves from the outside.

The state in which the protrusions of the ground member 3 penetrate the insulating layer 13 of the shielding film 1 and come into contact with the shielding layer 12 is not limited to an embodiment in which the conductive particles 3b of the conductive adhesive 32 act as protrusions as shown in FIG. 2. Examples thereof include an embodiment in which the ground member is formed by bending a conductive base material 31 such as a metal foil and is laminated on the insulating layer 13 without using the conductive adhesive 32, and a mountain-folded portion of the conductive base material 31 acts as protrusion of the ground portion and penetrates the insulating layer 13 to come into contact with the shielding layer 12. Examples of still another embodiment include an embodiment in which the ground member is formed of a conductive layer such as a metal foil, a conductive protrusion such as a metal is integrally or non-integrally provided on one surface of the conductive layer, the ground member is laminated on the insulating layer 13 without using the conductive adhesive 32, and the conductive protrusion acts as protrusion of the ground portion and penetrates the insulating layer 13 to come into contact with the shielding layer 12. Examples of the shape of the conductive protrusions include columns such as cylinders and prisms, and cones such as cones and pyramids.

The printed wiring board 2 includes a base member 21, a circuit pattern 23 partially provided on a surface of the base member 21, an insulation protective layer (coverlay) 24 covering and insulating and protecting the circuit pattern 23, and an adhesive layer 22 covering the circuit pattern 23 and adhering the circuit pattern 23 and the base member 21 to the insulation protective layer 24. The circuit pattern 23 includes a plurality of signal circuits 23a and ground circuits 23b. A through hole 25 is formed in the adhesive layer 22 and the insulation protective layer 24 on the ground circuit 23b for the purpose of ensuring conduction with the conductive adhesive layer 11 of the shielding film 1.

The shield printed wiring board X shown in FIG. 2 can be prepared by placing the ground member 3 on the shielding film 1 and then performing heat-pressing. The heat-pressing is generally performed under conditions of a temperature of about 150 to 190° C., a pressing force of about 1 to 3 MPa, and a time of about 1 to 60 minutes. In order to promote curing, post curing may be performed at 150 to 190° C. for 30 to 90 minutes after heat-pressing.

EXAMPLES

The present invention will now be described in more detail with reference to Examples, but the present invention is not limited to these Examples. The blending amounts shown in Table 1 are relative blending amounts of the respective components, and are represented by "parts by mass" unless otherwise specified.

Example 1

(1) Formation of Insulating Layer

A resin composition composed of an acrylic-modified epoxy resin and an acrylic resin was prepared at a ratio shown in Table 1, and the resin composition was applied onto the release-treated surface of the separate film as a base material so that the thickness of the insulating layer to be formed was 3 μm, followed by heat treatment at 100° C. for 120 seconds to form an insulating layer.

(2) Formation of Shielding Layer

A silver layer having a thickness of 0.1 μm was formed on the insulating layer thus obtained by a vapor deposition method.

(3) Formation of Conductive Adhesive Layer and Electromagnetic Wave Shielding Film An adhesive composition was prepared by adding a silver-coated copper powder to a composition containing a phosphorus-based flame retardant and an acrylic-modified epoxy resin so that the content ratio in the conductive adhesive layer was 20 mass %. Then, the adhesive composition was coated on the shielding layer thus obtained so as to have a thickness of 15 μm to form a coating film. As a coating method, a lip coat method was used. Then, the solvent component of the coating film was volatilized by heat treatment at 100° C. for 30 seconds to form a conductive adhesive layer.

As described above, an electromagnetic wave shielding film having a structure of conductive adhesive layer/shielding layer/insulating layer was prepared.

Examples 2 to 7 and Comparative Example 1

An electromagnetic wave shielding film was produced in the same manner as in Example 1 except that the components constituting the insulating layer and the conductive adhesive layer were changed as shown in Table 1.

(Evaluation)

Each electromagnetic wave shielding film obtained in Examples and Comparative Examples was evaluated as follows. The evaluation results are shown in the Table 1.

(1) Martens Hardness of Insulating Layer

For each of the electromagnetic wave shielding films obtained in Examples and Comparative Examples, a test sample of 1 mm square was cut out, the separator on the insulating layer was released off, and the Martens hardness was measured on a surface of the insulating layer using a dynamic microhardness tester (product name "DUH-211", manufactured by Shimadzu Corporation) under the following conditions.

Indenter shape: pyramid indenter)(115°)
Measurement method: single indentation measurement
Measurement temperature: 23° C.
Load: 0.10 mN
Load speed: 0.0060 mN/s
Load holding time: 2 s
Unloading holding time: 0 s (2) Martens Hardness of Conductive Adhesive Layer The Martens hardness of each of the conductive adhesive layers prepared in Examples and Comparative Examples was measured in the same manner as the Martens hardness of the insulating layer.

(3) Connection Resistance Value i) Preparation of Ground Member

An adhesive composition was prepared by adding a silver-coated nickel powder (average particle size 28 μm) to an epoxy resin composition so that the content ratio in the conductive adhesive layer was 35 mass %. Then, the adhesive composition was coated on a SUS sheet having a thickness of 0.2 mm so that the thickness of the conductive adhesive layer formed was 30 μm. Then, the solvent component of the coating film was volatilized by heat treatment at 100° C. for 30 seconds to form a conductive adhesive layer. As described above, a ground member made of a SUS sheet/conductive adhesive layer was prepared.

(ii) Measurement of Connection Resistance Value

The ground member thus obtained was cut into a test sample of 10 mm square, placed at 10 mm intervals on a surface of the insulating layer of each of the electromagnetic wave shielding films obtained in Examples and Comparative Examples, and bonded by performing heat-pressing, thereby preparing a sample for measurement. The heat-pressing was performed under the conditions of a temperature of 170° C., a pressure of 3 MPa, and a time of 30 minutes, and then post-curing was performed at 150° C. for 30 minutes. The connection resistance value between the adjacent ground members was measured through the shielding layer of the electromagnetic wave shielding film

TABLE 1

|  |  | Comp. Ex. 1 | Ex. 1 | Ex. 2 | Ex. 3 | Ex. 4 | Ex. 5 | Ex. 6 | Ex. 7 |
| --- | --- | --- | --- | --- | --- | --- | --- | --- | --- |
| Composition of insulating layer [w %] | Acrylic resin | 30 | 30 | 30 | 30 | 30 | 40 | 70 | 50 |
|  | Acrylic-modified epoxy resin | 70 | 70 | 70 | 70 | 70 | 60 | 30 | 50 |
| Composition of conductive adhesive layer [w %] | Acrylic-modified epoxy resin | 50 | 40 | 35 | 30 | 25 | 40 | 40 | 40 |
|  | Flame retardant | 30 | 40 | 45 | 50 | 55 | 40 | 40 | 40 |
|  | Silver-coated copper powder | 20 | 20 | 20 | 20 | 20 | 20 | 20 | 20 |

TABLE 1-continued

| | Comp. Ex. 1 | Ex. 1 | Ex. 2 | Ex. 3 | Ex. 4 | Ex. 5 | Ex. 6 | Ex. 7 |
|---|---|---|---|---|---|---|---|---|
| Martens hardness of insulating layer [N/mm$^2$] | 123.2 | 123.2 | 123.2 | 123.2 | 123.2 | 73.4 | 35.4 | 61.1 |
| Martens hardness of conductive adhesive layer [N/mm$^2$] | 28.8 | 75.4 | 102.2 | 163.8 | 164.5 | 75.4 | 75.4 | 75.4 |
| [Martens hardness of conductive adhesive layer/Martens hardness of insulating layer] | 0.23 | 0.61 | 0.83 | 1.33 | 1.34 | 1.03 | 2.13 | 1.23 |
| Connection resistance value [Ω] | ∞ | 0.354 | 0.274 | 0.266 | 0.196 | 0.363 | 0.544 | 0.455 |

It has been determined that the electromagnetic wave shielding films (Examples) of the present invention have a low connection resistance value between adjacent ground members, and can exhibit excellent conductivity between the ground member and the shielding layer. On the other hand, in a case where the ratio of the Martens hardness of the conductive adhesive layer to the Martens hardness of the insulating layer is less than 0.3 (Comparative Example 1), the connection resistance value between adjacent ground members exceeds the measurement limit.

REFERENCE SIGNS LIST

1 Electromagnetic wave shielding film
11 Conductive adhesive layer
12 Shielding layer
13 Insulating layer
X Shield printed wiring board
2 Printed wiring board
21 Base member
22 Adhesive layer
23 Circuit pattern
23a Signal circuit
23b Ground circuit
24 Insulation protective layer (coverlay)
25 Through hole
3 Ground member
31 Conductive base material
32 Conductive adhesive
3a Adhesive
3b Conductive particles
4 Electronic components

The invention claimed is:

1. An electromagnetic wave shielding film, comprising:
   a conductive adhesive layer, a shielding layer, and an insulating layer laminated in this order,
   wherein a ratio [conductive adhesive layer/insulating layer] of Martens hardness of the conductive adhesive layer in accordance with ISO14577-1 to Martens hardness of the insulating layer in accordance with ISO14577-1 is 0.3 or more.

2. The electromagnetic wave shielding film according to claim 1, wherein the Martens hardness of the insulating layer in accordance with ISO14577-1 is 3 to 150 N/mm$^2$.

3. The electromagnetic wave shielding film according to claim 1, wherein the Martens hardness of the conductive adhesive layer in accordance with ISO14577-1 is 20 to 200 N/mm$^2$.

* * * * *